(12) United States Patent
Ikeda et al.

(10) Patent No.: US 6,681,363 B1
(45) Date of Patent: Jan. 20, 2004

(54) DATA RECEIVER, DATA TRANSMISSION SYSTEM, AND DATA TRANSMITTING METHOD THEREFOR

(75) Inventors: Tamotsu Ikeda, Tokyo (JP); Yasunari Ikeda, Kanagawa (JP); Takahiro Okada, Saitama (JP); Koichi Tagawa, Kanagawa (JP); Moriyuki Kawaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/647,966

(22) PCT Filed: Feb. 9, 2000

(86) PCT No.: PCT/JP00/00706
§ 371 (c)(1),
(2), (4) Date: Dec. 12, 2000

(87) PCT Pub. No.: WO00/48322
PCT Pub. Date: Aug. 17, 2000

(30) Foreign Application Priority Data

Feb. 9, 1999  (JP) ............................................. 11-031971
Feb. 9, 1999  (JP) ............................................. 11-032066

(51) Int. Cl.⁷ ...................... H03M 13/37; H03M 13/35; H03M 13/29
(52) U.S. Cl. ...................... 714/758; 714/776; 714/784; 714/804
(58) Field of Search ................................ 714/755, 758, 714/776, 784, 804; 370/377

(56) References Cited

U.S. PATENT DOCUMENTS 5,014,276 A  *  5/1991  Bush et al. .................. 714/704
5,815,490 A  *  9/1998  Lu ............................... 370/377
6,357,029 B1 *  3/2002  Sinha et al. ................. 714/755

FOREIGN PATENT DOCUMENTS

JP          61-237523        10/1986
JP          2-39627           2/1990

* cited by examiner

Primary Examiner—R. Stephen Dildine
(74) Attorney, Agent, or Firm—Frommer Lawrence & Haug LLP; William S. Frommer; Darren M. Simon

(57) ABSTRACT

A data transmission system which allows received data to be decoded and reproduced in real time by simple decoding and which allows signal reproduction and recording by highly reliable error-correcting decoding, wherein a transmitter encodes transmission data by an error-correcting code enabling control of the error-correcting characteristic and the real-time characteristic at the receiving side and transmits it through a transmission line and a receiver 2a demodulates the received data by a demodulation circuit 102, decodes it by a simple decoding circuit 104 and simultaneously stores it in a storage circuit 110, demultiplexes the decoded data 105a by a demultiplexing circuit 106, and reproduces it by a reproduction circuit 123 in a form for viewing and listening by a user. A control circuit 122 obtains identification information related to the data to be recorded according to a record instruction 125, specifies the start and the end of the data to be reproduced to the storage circuit 110 and reads it, applies error-correcting decoding to it by an error-correcting decoding circuit 111, and records the demultiplexed information data 114 or data 116 reproduced by the source reproduction circuit 115 by a recording circuit 124.

17 Claims, 4 Drawing Sheets

| FRAME INDEX | START FLAG | END FLAG | REC REQUEST | DEMUX INFO |
|---|---|---|---|---|
| 1 | 0 | 0 | 0 | |
| 2 | 1 | 0 | 0 | |
| 3 | 0 | 0 | 1 | PID,PCR,CONTENTS_ID |
| 4 | 0 | 0 | 0 | |
| 5 | 0 | 1 | 0 | |

| FRAME INDEX | RAW DATA |
|---|---|
| 1 | RAW DATA#1 |
| 2 | RAW DATA#2 |
| 3 | RAW DATA#3 |
| 4 | RAW DATA#4 |
| 5 | RAW DATA#5 |

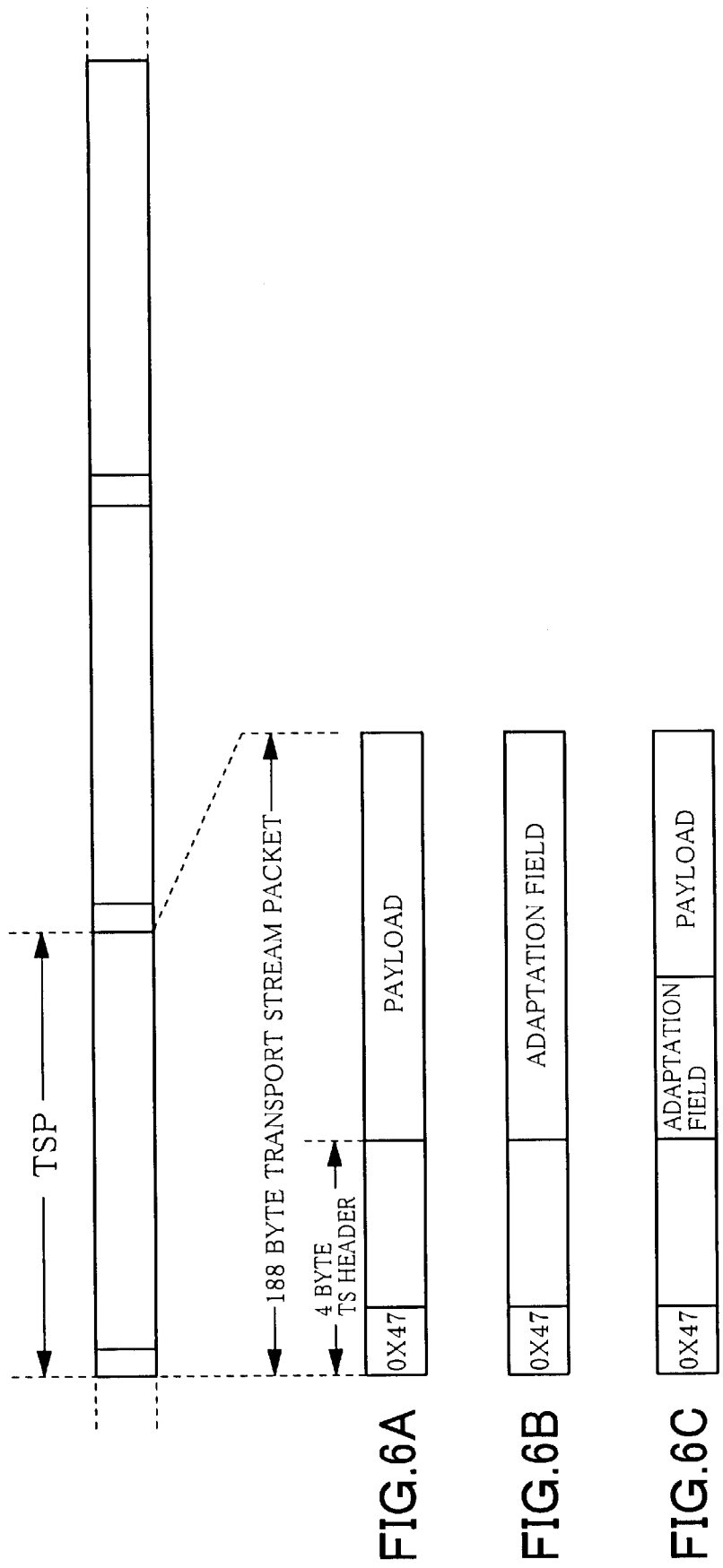

DATA RECEIVER, DATA TRANSMISSION SYSTEM, AND DATA TRANSMITTING METHOD THEREFOR

TECHNICAL FIELD

The present invention relates to a data transmission system and a data transmission and receiving apparatus, more particularly to a data receiving apparatus, a data transmission system, and a data transmission method therefor which relate to broadcasting and communication of digitized sound and image data and other data information, which receive data by a simple receiving method stressing real time and low power consumption at the time of BGM or free distribution and broadcasting, which allow highly reliable data reception at the time of storing received data or pay distribution and broadcasting, and which otherwise enable control of data reliability and receiving cost according to the mode of reception and which establish a charging system for distribution and broadcasting.

BACKGROUND ART

In the field of data transmission, especially in digital broadcasting, a transmission side encodes image, sound, and other source data, multiplexes the encoded data, applies channel encoding, and sends the data through an antenna or a transmission line. A receiving side basically applies processing reverse to that performed at the transmission side to reproduce the original data forming the source. In other words, it performs channel decoding, demultiplexing, and source decoding.

FIG. 5 shows an example of the configuration of a basic data transmission system. Here, the explanation is given assuming two kinds of sources. In FIG. 5, 5 and 6 are source data. Note that these source data include, for example, sound data, image data, composite data corresponding to a composite signal including both sound and image signals such as a TV signal, and computer information data such as software and databases handled by computers.

In FIG. 5, 10 and 11 are information-data generation circuits for performing predetermined processing on the source data 5 and 6, while 12 and 13 are information data generated by the information-data generation circuits 10 and 11. Reference numeral 14 shows a multiplexing circuit. The multiplexing circuit 14 multiplexes the information data 12 and 13 by a predetermined method to obtain the multiplexed data 15. Reference numeral 16 is a channel encoding circuit comprised of an encoding circuit 29 and a modulation circuit 30. The encoding circuit 29 performs error-correcting coding by a predetermined method. The modulation circuit 30 performs digital modulation by a predetermined method. Reference numeral 17 is channel-encoded data (hereinafter called transmission data). Reference numeral 18 is a transmission line. Here, the transmission line 18 is, for example, an electromagnetic wave.

In the transmission line 18, noise 28 is added to the transmission signal 17 from a noise source 27. Reference numeral 19 is a transmission signal to which noise is added. This becomes the signal input to a receiving apparatus. Reference numeral 20 is a channel decoding circuit comprised of a digital demodulator 31 and an error-correcting decoder 32. The digital demodulator 31 performs digital demodulation by a predetermined method. The error-correcting decoder 32 performs error-correcting decoding by a predetermined method. Reference numeral 21 is a channel-decoded result, while 22 is a demultiplexer. The demultiplexer 22 demultiplexes the data by a predetermined method. Reference numeral 23 is demultiplexed data corresponding to the information data 12, while 25 is an source reproduction circuit. Reference numeral 24 is demultiplexed data corresponding to the information data 13, while 26 is an source reproduction circuit. Source-reproduced data 33 and 34 are viewed and listened to in real time or stored in a storage medium such as tape or a disk. Data to be transmitted is shown in FIG. 6. Here, the data to be transmitted is, for example, a TS (transport stream) of MPEG-2 Systems (ITU-TH, 222, 0, ISO/IEC 13818-1). In this case, 12 and 13 shown in FIG. 5 are TS's of information data corresponding to the source data 5 and 6, respectively. The output of the multiplexing circuit 14, that is, the multiplexed data 15, is a TS comprised of the information data 12 and 13 multiplexed.

A TS is comprised of TSP's (transport stream packets). A TSP, as shown in FIG. 6, is a fixed-length packet comprised of a total of 188 bytes including a synchronization byte (0×47), a TS header (four bytes including the synchronization byte), and a data section of 184 bytes. The TS header includes a packet identifier, that is, PID (packet ID). The demultiplexer 22 at the receiving side demultiplexes the TSP's corresponding to the information data 12 and 13 based on the unique PID's assigned to the TS's of the information data 12 and 13 at the multiplexing circuit 14 of the transmission side. The TS header also includes an error indication flag (transport error indicator). If error is included in the corresponding TSP, the error indicating flag becomes 1, while if error is not included, the error indicating flag becomes 0. The receiving side usually discards or otherwise processes a TSP including error. The data section of 184 bytes can be one of three types: a payload (FIG. 6(A)), an adaptation field (FIG. 6(B)), and a payload and adaptation field (FIG. 6(C)).

Here, while the data is demultiplexed by the demultiplexer 22 based on the PID's, since the noise 28 is added to the transmission data 17 on the transmission line 18, if the channel-decoded data 21 includes error, the PID may have error and correct demultiplexing may not be possible. In this case, the demultiplexed data 23 corresponding to the information data 12 of the transmission side may be missing some TSP's and this will affect the source decoding. In other words, the drawback will occur of the image or sound being disturbed or interrupted. Note that the same applies to the demultiplexed data 24 corresponding to the information data 13 of the transmission side.

To keep these drawbacks to the minimum, error control is required when transmitting data over a transmission line having error. Error control is usually performed by the error-correcting coding circuit 29 in the channel encoding circuit 16. In particular, in transmission by a transmission medium having poor conditions such as in urban areas in terrestrial transmission, mobile reception, and at boundaries of service areas, the above loss of TSP's frequently occurs and the reliability of the data becomes a problem. For example, when a received signal is stored in a storage medium such as tape or disk for use, especially in the case of a pay service offered along with the future digitalization of communication and broadcasting, not only will the occurrence of error itself become a problem, but also the charging for error-ridden data may cause a serious problem. As a means for solving this problem, the method of making error correction more powerful etc. can be considered, but in general, if performing powerful error correction, the amount of processing for the decoding at the receiving side can be expected to also increase and the size of the receiving apparatus or the increased power consumption will become a problem. Further, in broadcasting, where real time is demanded, the delay caused by the decoding is desirably made as short as possible. Therefore, another means is desired.

The present invention has been made in consideration of the foregoing situation and has as its object is to provide a transmission system which allows highly real-time, simple decoding, while allowing error, when performing powerful error correction and which performs processing which allows a sufficient error-correcting characteristic to be achieved by performing predetermined processing. In addition, the present invention provides means for normally simply decoding the data transmitted by the above transmission system at a receiving side for viewing and listening, but, if necessary performing a predetermined error-correcting decoding to reproduce a desired piece of music with a high reliability and storing it in a storage medium.

DISCLOSURE OF INVENTION

To achieve the foregoing object, a data transmission system according to the present invention is a data transmission system for transmitting transmission data including at least one source data to a receiving side through a transmission line, comprising an encoding means for encoding the transmission data based on an error correcting coding method enabling control of the real-time characteristic and/or the error-correcting characteristic at the receiving side; a transmitting means for transmitting the transmission data encoded by said encoding means over the transmission line; a receiving means for receiving the transmission data over the transmission line; a first decoding means for decoding the data received by said receiving means by a first error correcting decoding method; a storage means for storing the data received by said receiving means; and a second decoding means for decoding the data stored by said storage means by a second error correcting decoding method.

Further, the data transmission method of the present invention is a data transmission method for transmitting transmission data including at least one source data to a receiving side through a transmission line, comprising a step of encoding the transmission data according to an encoding method enabling control of the real-time characteristic and/or error-correcting characteristic at the receiving side; a step of outputting the encoded transmission data through the transmission line; a step of receiving data through the transmission line; a step of decoding the received data by a first error correcting decoding method; a step of storing the received data; and a step of decoding the stored data by a second error correcting decoding method.

Further, the data receiving apparatus according to the present invention is a data receiving apparatus for receiving transmission data encoded by an encoding method enabling control of the real-time characteristic and/or error-correcting characteristic at the receiving side and modulated through a transmission line, comprising a demodulation means for demodulating the transmission data; a first decoding means for decoding the data demodulated by said demodulation means by a first error correcting decoding method; a first demultiplexing means for demultiplexing the data decoded by said first decoding means; a storage means for storing the data demodulated by said demodulation means; a second decoding means for decoding the data stored by said storage means by a second error correcting decoding method; and a second demultiplexing means for demultiplexing the data decoded by said second decoding means.

Further, preferably, in the present invention, the first decoding means has a higher real-time characteristic than the second decoding means.

Further, preferably, in the present invention, the second decoding means has a higher error-correcting capability than the first decoding means.

Further, preferably, in the present invention, there are further provided a reproducing means for reproducing sound and/or image signals for viewing and listening of the user from the data demultiplexed by the first demultiplexing means and a recording means for recording the data demultiplexed by the second demultiplexing means on a predetermined recording medium.

BRIEF DESCRIPTION OF DRAWINGS

FIG. 6 is a view of the configuration of a data packet transmitted by a data transmission system.

BEST MODE FOR CARRYING OUT THE INVENTION

Figure 1:
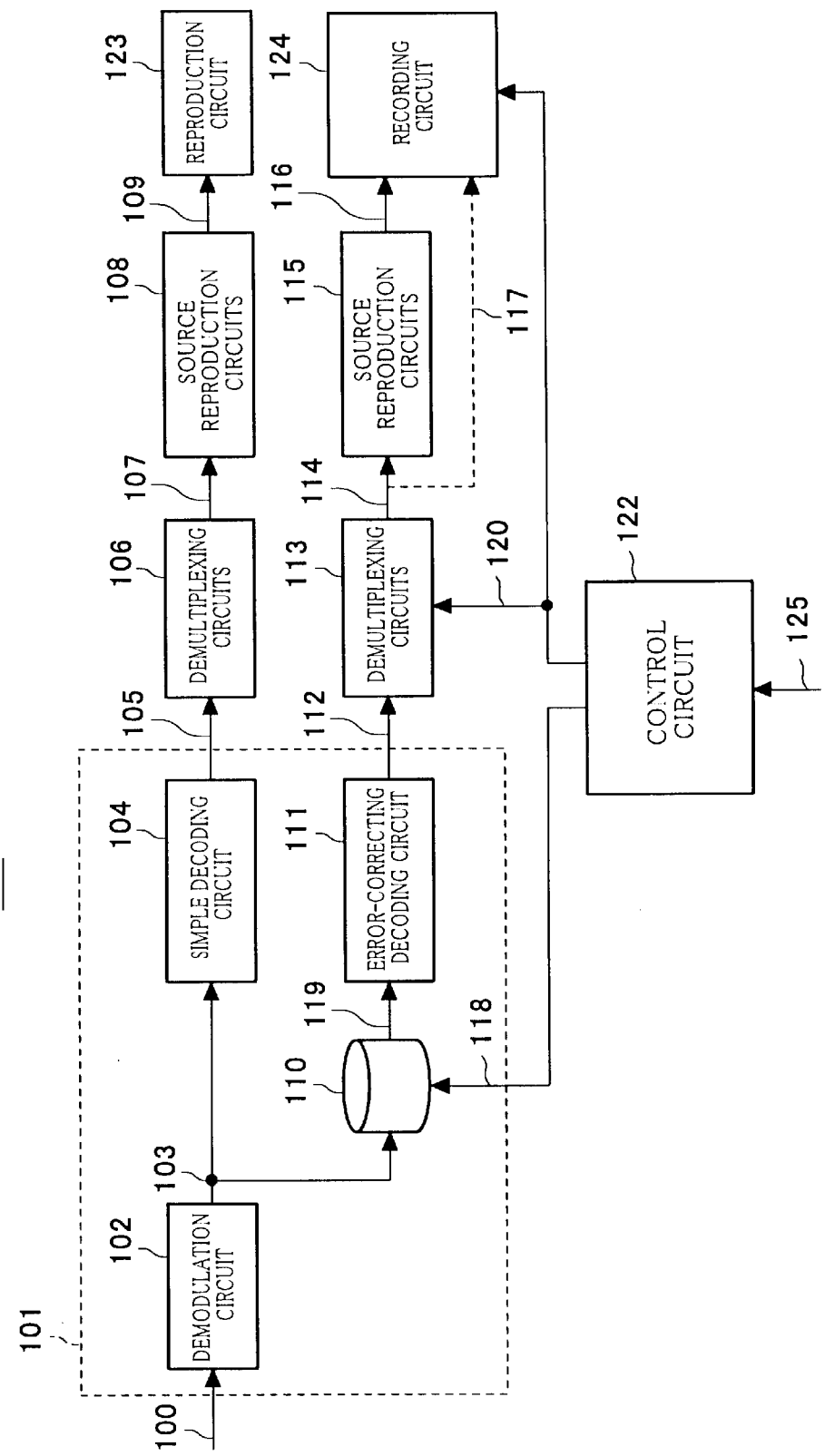
FIG. 1 is a circuit diagram of a part of a data transmission system according to an embodiment of the present invention and a circuit diagram of a data receiver in the data transmission system.

FIG. 1 is a circuit diagram of a receiver side of a data transmission system according to an embodiment of the present invention.

Figure 5:
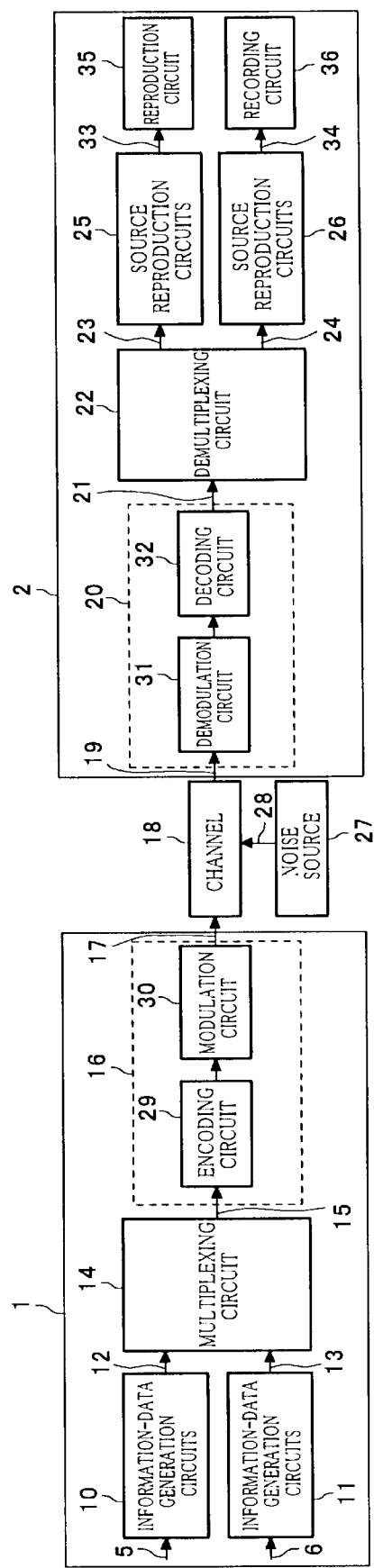
FIG. 5 is a view of the configuration of a general data transmission system.

The data transmission system of the present embodiment is comprised of a transmitter, a data transmission line, and a receiver. The transmitter has substantially the same structure as a transmitter of the data transmission system shown in FIG. 5. However, when the channel encoding circuit 16 in the transmitter encodes the multiplexed data 15, it performs the encoding by using a code enabling control of the real-time characteristic and error-correcting characteristic at the time of reception in accordance with the amount of the receiving processing of the receiver. For example, it encodes the multiplexed data 15 by a product code using a systematic code, here the Reed-Solomon code, in the column direction and row direction. The receiving side can decode and reproduce the data using a simple decoding method and, in this case, keep the amount of data processing small, increase the speed of decoding, and reproduce the data in real time with a low power consumption. On the other hand, it can reproduce the data using a decoding method which is able to obtain a sufficient error-correcting characteristic and, in this case, although the load of data processing is large due to the error correction, reproduce the original transmission data in a state with little error even from transmission data containing a certain extent of noise and realize highly reliable data reproduction.

FIG. 1 is a circuit diagram of an example of the configuration of a receiver for receiving data encoded by the above encoding method.

As shown in the figure, a receiver 2a according to the present embodiment is comprised of a channel decoding circuit 101, demultiplexing circuits 106 and 113, source reproduction circuits 108 and 115, a reproduction circuit 123, a recording circuit 124, and a control circuit 122.

The channel decoding circuit 101 is comprised of a demodulation circuit 102, a simple decoding circuit 104, a storage circuit 110, and an error-correcting decoding circuit 111.

The demodulation circuit 102 demodulates transmission data 100 transmitted through a transmission line and outputs demodulated data 103.

The simple decoding circuit 104 applies simple decoding to the demodulated data 103. When the error correcting code used in the channel coding by the transmission side is a product code using a Reed-Solomon code in the column direction and row direction, as simple decoding, (1) performing error correction using only the parity in the row direction, (2) performing error correction using only the parity in the column direction, and (3) performing decoding without using parity at all, that is, outputting the systematic elements corresponding to the original data before coding substantially without error correction, may be mentioned. Since the simple decoding performs only relatively simple error correction or does not perform error correction in this way, the amount of data processing required for decoding is relatively small, real-time decoding is possible, and low power consumption can be achieved. As a result of the simple decoding, first decoded data 105 is output.

The storage circuit 110 is a large capacity storage device comprised of a hard disk, semiconductor memory, etc. and stores the demodulated data 103 of the demodulation circuit 102. Note that the storage circuit 110 is comprised, for example, of a so-called ring-buffer storage device having a repeat storage function. When new data is input after an amount of data corresponding to the storage capacity is stored, the data having the oldest time of input is erased and the new data is stored over it. Therefore, the storage circuit 110 always holds the latest data of the amount of the storage time corresponding to the storage capacity counted back from the most recent time of input.

The error-correcting decoding circuit 111 performs error-correcting decoding on the stored data 119 of the storage unit 110 by a decoding method giving a sufficient error-correcting characteristic. As described above, when the error-correcting coding used in the channel coding at the transmission side is a product code using a Reed-Solomon code in the column direction and row direction, as the error-correcting decoding, (1) the erasure correction method, (2) iterative decoding method, (3) minimum distance decoding method, Ready-Robinson decoding method, etc. can be applied. Since the error-correcting decoding performs error correction having a higher reliability than that of the simple decoding performed by the simple decoding circuit 104, although the amount of data processing required for decoding is large and real-time decoding is difficult to achieve, the decoded data 112 obtained by the decoding is highly reliable, and data can be reproduced with a relatively high reliability even if the transmission conditions of the transmission line are poor and the S/N ratio of the received data is low.

The demultiplexing circuit 106 demultiplexes the decoded data 105 from the simple decoding circuit 104. Therefore, when the received data 100 includes a plurality of source data, for example, each source data is separated and the separated source data 107 is output.

The demultiplexing circuit 113 has substantially the same function as the demultiplexing circuit 106. The demultiplexing circuit 113 demultiplexes the decoded data 112 from the error-correcting decoding circuit 111. Therefore, the plurality of source data included in the received data 100 are separated, and the separated source data 114 is output.

The source reproduction circuits 108 and 115 reproduce a signal which can be viewed and listened to from the source data 107 demultiplexed by the demultiplexing circuits 106 and 113. When the source data is music data, for example, they reproduce a music signal from the music data. When the source data is composite data formed of sound data and image data, they reproduce a sound signal and an image signal from the sound data and the image data.

Note that when the source data is data compressed according to a predetermined data compression method, the source reproduction circuits 108 and 115 decompress the data, then reproduce signals from the decompressed data.

The reproduction circuit 123 reproduces a sound signal or an image signal for viewing or listening from an source signal 109 reproduced by the information-signal reproduction circuit 108. When the source signal 109 is a music signal, for example, it outputs that piece of music to a speaker. When the source signal 109 is an image signal, it displays the image signal on a monitor.

The recording circuit 124 records an source signal 116 reproduced by the source reproduction circuit 115 or directly records data 117 separated from the source data 114 demultiplexed by the demultiplexing circuit 113.

The recording medium of the recording circuit 124 may be any of a magnetic recording medium such as magnetic tape and a magnetic disk, an optical disk, or a semiconductor storage medium such as a memory card. Any recording medium having a required storage capacity can be used.

When directly recording the demultiplexed source data 117 on a recording medium, if the source data is compressed data, for example, the amount of recorded data becomes smaller than when recording an source signal 116 which has been decompressed and reproduced. Therefore, a larger amount of information can be stored in a recording medium having an identical capacity. Note that to reproduce data recorded as compressed as described above, the reproduction apparatus has to have a function for reading and decompressing compressed data.

The control circuit 122 controls the operations of each of the channel decoding circuit 101, the demultiplexing circuits 106 and 113, the source reproduction circuits 108 and 115, the reproduction circuit 123, and the recording circuit 124 according to various instructions input through a user interface etc. When receiving from the user interface a record instruction 125 for recording data being reproduced for example, the control circuit 122 extracts information for identifying the data being currently reproduced from the demultiplexed data 107 corresponding to the data being currently reproduced by the reproduction circuit 123.

The transmitter adds to each source data identification data such as an indicator for indicating the start and the end of the source data and an identifier for uniquely identifying the source data. Therefore, the control circuit 122 extracts the identifier of the data being currently reproduced and extracts the indicator of the data to obtain the start position and the end position in the storage circuit 110 corresponding to the data being reproduced. The circuit reads data from the start position to the end position from the storage circuit 110 and outputs it to the error-correcting decoding circuit 111. The demultiplexing circuit 113 demultiplexes the decoded data 112 output from the error-correcting decoding circuit 111, then the source-signal reproduction circuit 115 reproduces the reproduced signal 116 from the demultiplexed data 114 and outputs it to the recording circuit 124 which then records it on a recording medium. Alternatively, the data 117 separated from the demultiplexed data 114 is directly sent to the recording circuit 124 and recorded on a recording medium.

Note that, as described above, the control circuit 122 records data being currently reproduced based on an instruction from the outside and also, for example, can control the system so as to decode and record all of the data stored by the storage circuit 110 or extract, perform error-correcting decoding, and then record only data specified by the user from a plurality of data stored by the storage circuit 110.

The operation of the data transmission system of the present embodiment will be described below.

The transmitter in the data transmission system of the present embodiment encodes the TS (for example, the multiplexed data 15 shown in FIG. 1) multiplexed by the MPEG-2 systems by the channel encoding circuit 16 shown in FIG. 1 and outputs it to the transmission line 18. Note that, the TS includes a PRC (program clock reference) indicating the reference time used for synchronous control during decoding, an identifier indicating the start and the end of sequence data of a music data, etc. in an adaptation field and/or a PES (packetized elementary stream), and an identifier for identifying a piece of music, etc. in an adaptation field and/or PES. The channel encoding circuit 16 performs the error-correcting coding.

Figures 2, 3, 4:
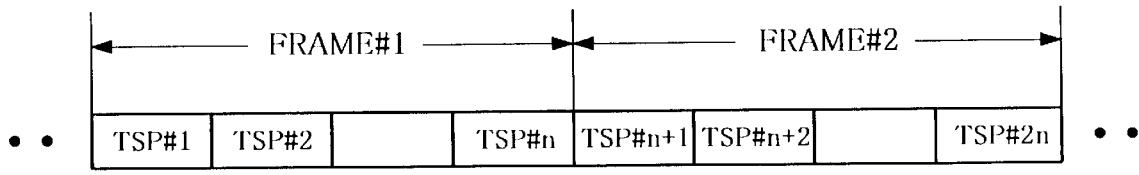
FIG. 2 is view of an example of the configuration of a TS comprising the transmission data.
FIG. 3 is view of the content of a table linked with demultiplexed data.
FIG. 4 is a view of the content of demodulated data stored in a storage circuit.

Note that the channel encoding circuit 16 defines n number of TSP's as one frame as shown in FIG. 2, encodes in units of frames, and outputs the encoded data. The TS shown in FIG. 2 corresponds to the multiplexed TS of FIG. 1, that is, the multiplexed data 15. The error-correcting code used here enables control of an error-correcting characteristic at the time of reception according to the amount of receiving processing at the receiver. As described above, for example, it is a product code using a systematic code, here, the Reed-Solomon code, in the column direction and row direction.

First, the receiver 2a shown in FIG. 1 receives the received signal 100 and inputs it to the channel decoding circuit 101. In the channel decoding circuit 101, the demodulation circuit 102 demodulates the signal and outputs the demodulated data 103. Usually, the simple decoding circuit 104 applies simple decoding to obtain he decoded data 105. The demultiplexing circuit 106 demultiplexes the multiplexed data, for example, to separate desired music and other data. The source reproduction circuit 108 reproduces the source signal from the demultiplexed data 107 to obtain the viewable and listenable source signal 109. The sound signal in the source signal is reproduced by a speaker etc., while the image signal is displayed on a monitor etc. for viewing and listening by the user.

At the same time as separating the desired music or other data, the demultiplexing circuit 106 generates a table for managing the demultiplexed music and other data as shown in FIG. 3. As shown in FIG. 3, this table includes a column (frame index) for storing frame indexes, a column (start flag) for storing the start of a piece of music etc., a column (end flag) for storing the end of a piece of music etc., a column (rec. request) for storing a recording request generated by a record instruction from the user, and a column (DEMUX info) for storing a PID (packet ID), a PCR (program clock reference), and a music identifier of a separated piece of music. The column for storing frame indexes stores the indexes of frames which include a desired piece of music.

When the column for storing the start of a piece of music contains a flag indicating the start of a desired piece of music in a frame corresponding to the frame index, "1" is, for example, stored, while when not, "0" is, for example, stored. When the column for storing the end of a piece of music contains a flag indicating the end of a desired piece of music in the frame corresponding to the frame index, "1" is, for example, stored, while when not, "0" is, for example, stored. When the column for storing a record request contains a record instruction which requests a desired piece of music etc. be recorded, "1" is, for example, stored, while when not, "0" is, for example, stored.

The column for storing the PID, the PCR, and the music identifier of a separated piece of music etc. contains an indicator or identifier in a row corresponding to a frame index having a recording request instruction. No information has to be stored in other rows.

Note that the table shown in FIG. 3 is, for example, generated by the control circuit 122 according to the demultiplexed data separated by the demultiplexing circuit 106 and is stored in the control circuit 122. A record instruction which requests a desired piece of music etc. to be stored is input to the control circuit 122 through a not shown user interface provided, for example, for the receiver 2a. More specifically, for example, a record instruction is issued when the user presses a record button provided on the receiver 2a.

Here, the method of analysis of a TS in the demultiplexing circuit 106, that is, the method for extracting the PID, the PCR, the start flag, the end flag, and the music identifier of a desired piece of music, will be described. First, the PID and PCR of the desired piece of music etc. are extracted by a general method for extracting a desired piece of music from a TS of the MPEG-2 systems. More specifically, a PAT (program association table) is extracted, a PMT (program map table) PID is extracted from the number of the desired piece of music, and the PCR PID and the PID of the piece of music are extracted from the PMT. The demultiplexing circuit 106 separates TSP's having the PID of the piece of music and the PCR PID. A TSP includes a start flag, an end flag, and the music identifier multiplexed. The start flag is analyzed by the control circuit 122 and the demultiplexing circuit 106, predetermined data is stored in the column for storing the start of a piece of music in the table shown in FIG. 3, the end flag is analyzed, and predetermined data is stored in the column for storing the end of a piece of music shown in FIG. 3. In the example shown in FIG. 3, the start of the piece of music is included in the TSP included in the frame index 2, the recording request is assigned by the frame index 3, and the end of the piece of music etc. is indicated by the TSP included in the frame index 4.

The storage unit 110 generates and stores a storage data table for managing the data of a desired piece of music etc. as shown in FIG. 4. The storage data table includes a column (frame index) for storing frame indexes and a column (row data) for storing frame data. The column for storing frame indexes stores frame index numbers. The column for storing frame data stores frame data corresponding to frame indexes. In FIG. 4, data having frame indexes 1 to 5 are stored as an example.

When a listener issues a record instruction while listening to a piece of music etc. reproduced by the simple decoding method, 1 is stored in the area for storing a recording request in the table shown in FIG. 3, and the information of the PID, the PCR, and the music identifier of the piece of music to be stored is stored in the area for storing the PID, the PCR, and the music identifier of a piece of music to be separated.

When the record instruction 125 is received, the control circuit 122 shown in FIG. 1 outputs a read signal 118 to the storage circuit 110. When the read request 118 is output, information such as the frame index including the start of the piece of music for which the record request has been issued and the frame index including the end of the piece of music for which the record request has been issued is output to the storage circuit 110 together with the read signal 118 according to the table shown in FIG. 3. The storage circuit 110 reads data from the start frame to the end frame specified respectively by the start flag and the end flag sent together with the read signal 118. The read data is output to the error-correcting decoding circuit 111 where it is decoded, and the decoded data 112 is sent to the demultiplexing circuit 113. The demultiplexing circuit 113 analyzes the TS in the same way as in the demultiplexing circuit 106, separates the desired piece of music, extracts the start position and the end position of the piece of music, and obtains the demultiplexed data 114. The demultiplexed data 114 is reproduced by the source reproduction circuit 115, is sent to the storage circuit 124, and is recorded in a recording medium such as tape or a disk. Alternatively, the demultiplexed data 114 is stored as is in a recording medium such as tape or a disk.

Note that, in FIG. 1, the storage circuit 110 and the error-correcting decoding circuit 111 may be arranged in a reverse order. In other words, decoding may first be performed by the error-correcting decoding circuit 111 and then the decoded data 112 stored in the storage circuit 110.

The data recording area of the storage circuit 110 and the demultiplexing circuit 106 may be configured in a so-called ring buffer format. In other words, they may be configured so that, when a data recording area is provided for the frame indexes 1 to 5 as shown in FIG. 3 and FIG. 4, the frames having the frame indexes 1 to 5 are stored, frame data of a frame index 6 is overwritten at the portion where the frame index 1 is stored, irrespective of whether a recording request is issued, and new data is stored in the same way. In this case, as indicated below, it is possible to provide a holding area just for giving a certain time margin to a recording request.

In the above description, the explanation was given of an embodiment where a recording request was issued for a piece of music etc. being listened to etc. by simple decoding, but, for example, it is also possible to provide a means for issuing a recording request for a piece of music played immediately before by a pushbutton specifying a piece of music to be recorded, assign a value indicating a recording request to the column for storing a recording request for the piece of music immediately before in the table shown in FIG. 3 corresponding to the data demultiplexed by the demultiplexing circuit 106, have the control circuit 122 issue a read request for the piece of music immediately before as the read signal 118, and store the piece of music immediately before according to the processing described above.

Note that, in the embodiment described above, the explanation was given of the use of a product code using the Reed-Solomon code in the column direction and the row direction as the error correcting code enabling control of the real-time characteristic and/or the error-correcting characteristic at the receiving side, but it is also possible to use for example a concatenated code of a convolutional code, a turbo code, or codes further concatenating the same. In this case, by setting the number of iterative decodings of the simple decoding circuit 104 smaller than the number of iterative decodings of the error-correcting decoding circuit 111, decoding with higher real-time characteristic can be obtained by the simple decoding circuit 104, while decoding with a higher error-correcting characteristic can be obtained by the error-correcting decoding circuit 111.

As described above, according to the present embodiment, the transmitter encodes transmission data by an error-correcting code enabling control of the real-time characteristic and/or error-correcting characteristic at the receiving side and transmits it through the transmission line, while, at the receiver 2a, the demodulation circuit 102 demodulates the received data 100, the simple decoding circuit 104 decodes the demodulated data 103 and simultaneously the storage circuit 110 stores it, the demultiplexing circuit 106 demultiplexes the decoded data 105, the source reproduction circuit 108 reproduces the separated information data 107, and the reproduction circuit 123 reproduces the reproduced signal 109 to a form which the user can view and listen. The control circuit 122 obtains identification information related to the data to be recorded specified by the record instruction signal 125 sent from the user based on the information data 107, specifies the start and the end of the data to be reproduced to the storage circuit 110 and reads it, decodes the read data 119 by the error-correcting decoding circuit 111, reproduces the information data 114 demultiplexed by the demultiplexing circuit 113, by the source reproduction circuit 115, and records it by the recording circuit 124 or records the information data 114 as is by the recording circuit 124, so the received data can be viewed and listened to in real time and the received data can be reproduced and recorded highly reliably by error correction.

Capability of Utilization in Industry

As described above, according to the data transmission system and data transmission method therefor of the present invention, a transmitting side transmits data encoded by a code enabling control of the error-correcting characteristic and real-time characteristic at the time of reception in accordance with the amount of the receiving processing in the receiver through a transmission line, while a receiving side can decode and reproduce the received data in real time by a simple decoding method to provide it to the user for viewing and listening and, according to a record instruction sent from the user, can apply error-correcting decoding by a decoding method giving a sufficient error-correcting characteristic to the received data to thereby reproduce and record highly reliable data. Therefore, there is the advantage that both real time viewing and listening and reliability of recorded data can be secured.

What is claimed is:

1. A data transmission system for transmitting transmission data including at least one source data to a receiving side through a transmission line, comprising:

an encoding means for encoding the transmission data according to an error-correcting coding method enabling control of the real-time characteristic and/or the error-correcting characteristic at the receiving side;

a transmitting means for transmitting the transmission data encoded by said encoding means through the transmission line;

a receiving means for receiving the transmission data through the transmission line;

a first decoding means for decoding the data received by said receiving means by a first error-correcting decoding method;

a storage means for storing the data received by said receiving means;

a second decoding means for decoding the data stored by said storage means by a second error-correcting decoding method; and recording means for recording the data decoded by said second decoding means on a predetermined recording medium according to a record instruction.

2. A data transmission system according to claim 1, wherein the source data is sound and/or image data.

3. A data transmission system according to claim 1, further comprising a data compression means for compressing the source data according to a predetermined data compression method and for sending compressed data to said encoding means.

4. A data transmission system according to claim 1, wherein said storage means for storing data received by said receiving means is a ring memory having a predetermined storage capacity, data having the oldest time of input is overwritten when new data is input to the ring memory, and the most recent data of an amount of a predetermined time corresponding to the storage capacity is stored in the ring memory.

5. A data transmission system according to claim 1, wherein the first decoding means has a higher real time characteristic than the second decoding means.

6. A data transmission system according to claim 1, wherein the second decoding means has a higher error-correcting capacity than the first decoding means.

7. A data transmission system according to claim 1, further comprising a reproducing means for reproducing sound and/or image signals for viewing and listening of the user from the data decoded by said first decoding means.

8. A data transmission system according to claim 1, wherein the source data is comprised of a plurality of partial data and each partial data includes indication information indicating the start and the end of the partial data.

9. A data transmission system according to claim 1, wherein the source data is comprised of a plurality of partial data and each partial data includes identification information by which the partial data can be uniquely identified.

10. A data transmission system according to claim 1, wherein the source data includes reference-time information indicating a reference time used for reproducing the source data at the receiving side.

11. A data transmission system according to claim 1, wherein said recording means records predetermined partial data on the recording medium according to indication information indicating the start and the end of each partial data included in the data decoded by said second decoding means when receiving a record instruction.

12. A data transmission system according to claim 8, further comprising a control means for linking partial data decoded by said first decoding means and reproduced by said reproducing means with data stored by said storage means and, when receiving a record instruction, extracting indication information indicating the start and the end of the partial data added to the partial data reproduced by said reproducing means, reading stored data from a start position to an end position according to the extracted indication information from said storage means, and outputting it to said second decoding means and recording means for recording data from a start time to an end time corresponding to the indication information extracted by said control means in the data decoded by said second decoding means on a predetermined recording medium when receiving a record instruction.

13. A data transmission system according to claim 12, wherein, when receiving the record instruction, said control means extracts identification information, attached to the partial data reproduced by said reproducing means, by which the partial data can be uniquely identified, and controls a read operation of partial data to be reproduced, stored by said storage means, based on the extracted identification information.

14. A data receiving apparatus for receiving transmission data encoded by an encoding method enabling control of the real-time characteristic and/or the error-correcting characteristic at the receiving side and modulated through a transmission line, comprising:

a demodulating means for demodulating the transmission data;

a first decoding means for decoding the data demodulated by said demodulating means by a first error-correcting decoding method;

a first demultiplexing means for demultiplexing the data decoded by said first decoding means;

a storage means for storing the data demodulated by said demodulating means;

a second decoding means for decoding the data stored by said storage means by a second error-correcting decoding method; and a second demultiplexing means for demultiplexing the data decoded by said second decoding means.

15. A data receiving apparatus according to claim 14, wherein the first decoding means has a higher real-time characteristic than the second decoding means.

16. A data receiving apparatus according to claim 14, wherein the second encoding means has a higher error-correcting capability than the first decoding means.

17. A data receiving apparatus according to claim 14, further comprising:

a reproducing means for reproducing sound and/or image signals for viewing and listening by a user from the data demultiplexed by said first demultiplexing means and a recording means for recording the data demultiplexed by said second demultiplexing means on a predetermined recording medium.

* * * * *